United States Patent
Walker (10) Patent No.: US 11,828,783 B1
(45) Date of Patent: Nov. 28, 2023

(54) FIFTH WHEEL TRAILER LIGHT TESTING DEVICE

(71) Applicant: William Walker, San Diego, CA (US)

(72) Inventor: William Walker, San Diego, CA (US)

(*) Notice: Subject to any disclaimer, the term of this patent is extended or adjusted under 35 U.S.C. 154(b) by 0 days.

(21) Appl. No.: 17/839,678

(22) Filed: Jun. 14, 2022

(51) Int. Cl.
*G01R 31/00* (2006.01)
*B60Q 1/00* (2006.01)
*G01R 31/44* (2020.01)

(52) U.S. Cl.
CPC ......... *G01R 31/006* (2013.01); *B60Q 1/0094* (2013.01); *G01R 31/44* (2013.01)

(58) Field of Classification Search
CPC ..... G01R 31/006; G01R 31/44; B60Q 1/0094
See application file for complete search history.

(56) References Cited

U.S. PATENT DOCUMENTS

| | | | | |
|---|---|---|---|---|
| 9,069,026 B1* | 6/2015 | Rutkowsky | ............ | G01R 31/44 |
| 2009/0212784 A1* | 8/2009 | Kilian | ............ | G01R 31/44 |
| | | | | 324/504 |
| 2012/0146653 A1* | 6/2012 | Rybolt | ............ | G01R 31/44 |
| | | | | 324/504 |
| 2016/0121792 A1* | 5/2016 | Christopherson | ...... | G01R 31/44 |
| | | | | 340/431 |
| 2020/0088777 A1* | 3/2020 | Marshall | ............ | G01R 1/0416 |
| 2020/0130566 A1* | 4/2020 | Albritton | ............ | H05B 47/10 |
| 2020/0189453 A1* | 6/2020 | Tucker | ............ | F21V 23/0407 |
| 2020/0298642 A1* | 9/2020 | Arakelian | ............ | B60Q 11/005 |
| 2022/0363207 A1* | 11/2022 | Gallo | ............ | B60D 1/64 |

* cited by examiner

Primary Examiner — Akm Zakaria
(74) Attorney, Agent, or Firm — Kyle A. Fletcher, Esq.

(57) ABSTRACT

The fifth wheel trailer light testing device is a maintenance device. The fifth wheel trailer light testing device is adapted for use with a trailer. The fifth wheel trailer light testing device comprises the plurality of trailer lights, a plurality of flashing circuits, a plurality of isolation diodes, a plurality of switches, and a wiring harness connector. The plurality of trailer lights, the plurality of flashing circuits, the plurality of isolation diodes, the plurality of switches, and the wiring harness connector are electrically interconnected. The fifth wheel trailer light testing device electrically tests a plurality of trailer lights. The fifth wheel trailer light testing device illuminates the plurality of trailer lights to be sure that each trailer light selected from the plurality of trailer lights is operating. The fifth wheel trailer light testing device is further configured to simultaneously flash all of the plurality of trailer lights.

14 Claims, 5 Drawing Sheets

FIFTH WHEEL TRAILER LIGHT TESTING DEVICE

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of vehicle lighting and signaling systems, more specifically, arrangements of electronic circuits separated from the light source. (B60Q1/0094)

SUMMARY OF INVENTION

The fifth wheel trailer light testing device is a maintenance device. The fifth wheel trailer light testing device is adapted for use with a trailer. The fifth wheel trailer light testing device comprises the plurality of trailer lights, a plurality of flashing circuits, a plurality of isolation diodes, a plurality of switches, and a wiring harness connector. The plurality of trailer lights, the plurality of flashing circuits, the plurality of isolation diodes, the plurality of switches, and the wiring harness connector are electrically interconnected.

The fifth wheel trailer light testing device electrically tests a plurality of trailer lights. The fifth wheel trailer light testing device illuminates the plurality of trailer lights to be sure that each trailer light selected from the plurality of trailer lights is operating. The fifth wheel trailer light testing device is further configured to simultaneously flash all of the plurality of trailer lights.

These together with additional objects, features and advantages of the fifth wheel trailer light testing device will be readily apparent to those of ordinary skill in the art upon reading the following detailed description of the presently preferred, but nonetheless illustrative, embodiments when taken in conjunction with the accompanying drawings.

In this respect, before explaining the current embodiments of the fifth wheel trailer light testing device in detail, it is to be understood that the fifth wheel trailer light testing device is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the fifth wheel trailer light testing device.

It is therefore important that the claims be regarded as including such equivalent construction insofar as they do not depart from the spirit and scope of the fifth wheel trailer light testing device. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
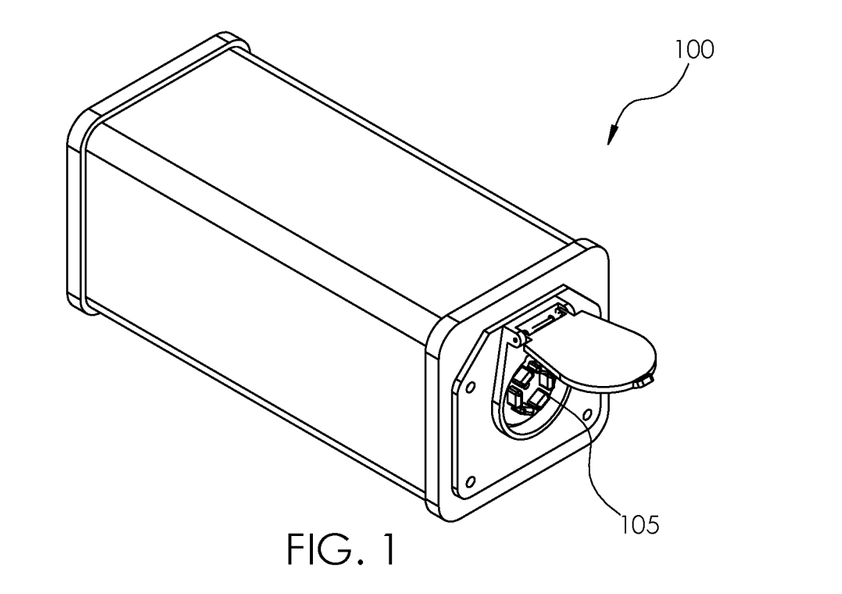
FIG. 1 is a perspective view of an embodiment of the disclosure.
Figure 2:
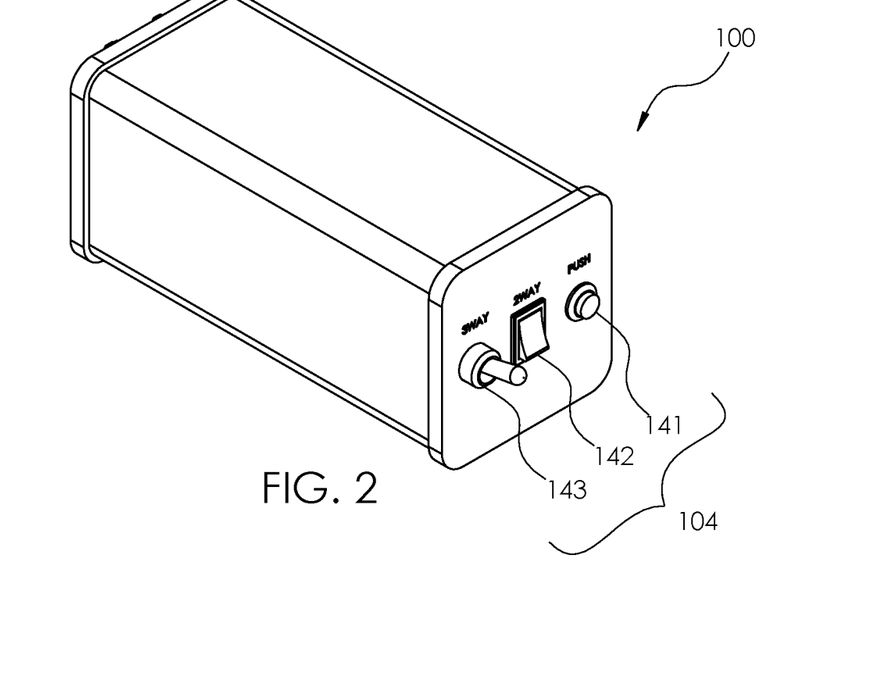
FIG. 2 is a perspective view of an embodiment of the disclosure.
Figure 3:
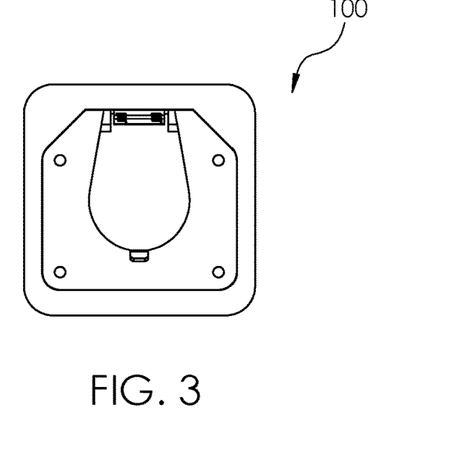
FIG. 3 is a front view of an embodiment of the disclosure.
Figure 4:
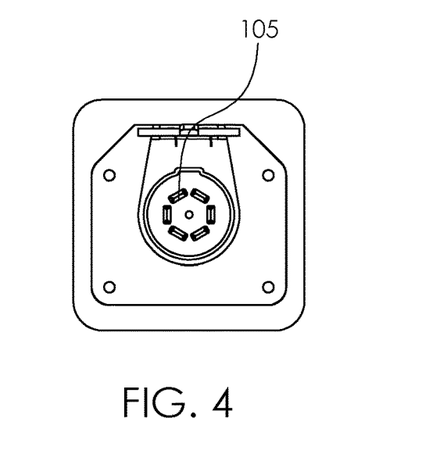
FIG. 4 is a front view of an embodiment of the disclosure.
Figure 5:
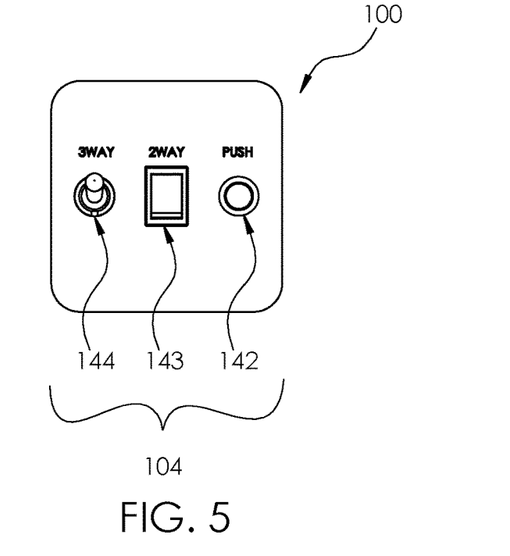
FIG. 5 is a rear view of an embodiment of the disclosure.
Figure 6:
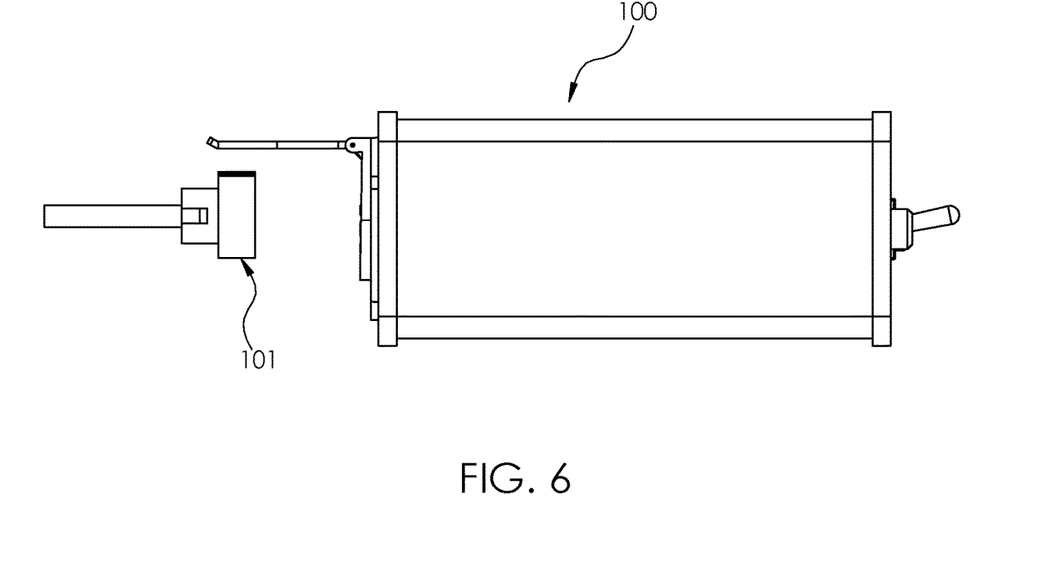
FIG. 6 is a side view of an embodiment of the disclosure.
Figure 7:
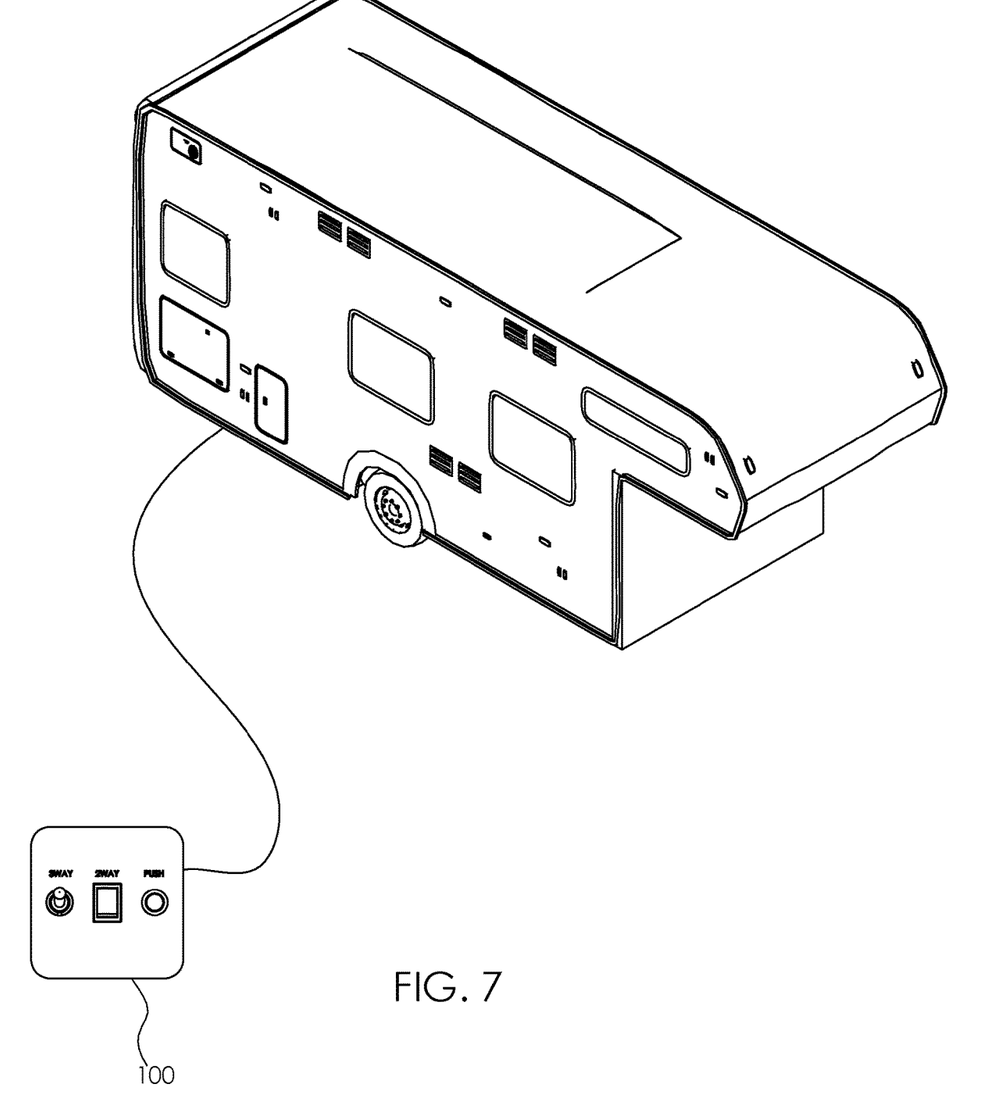
FIG. 7 is an in-use view of an embodiment of the disclosure.
Figure 8:
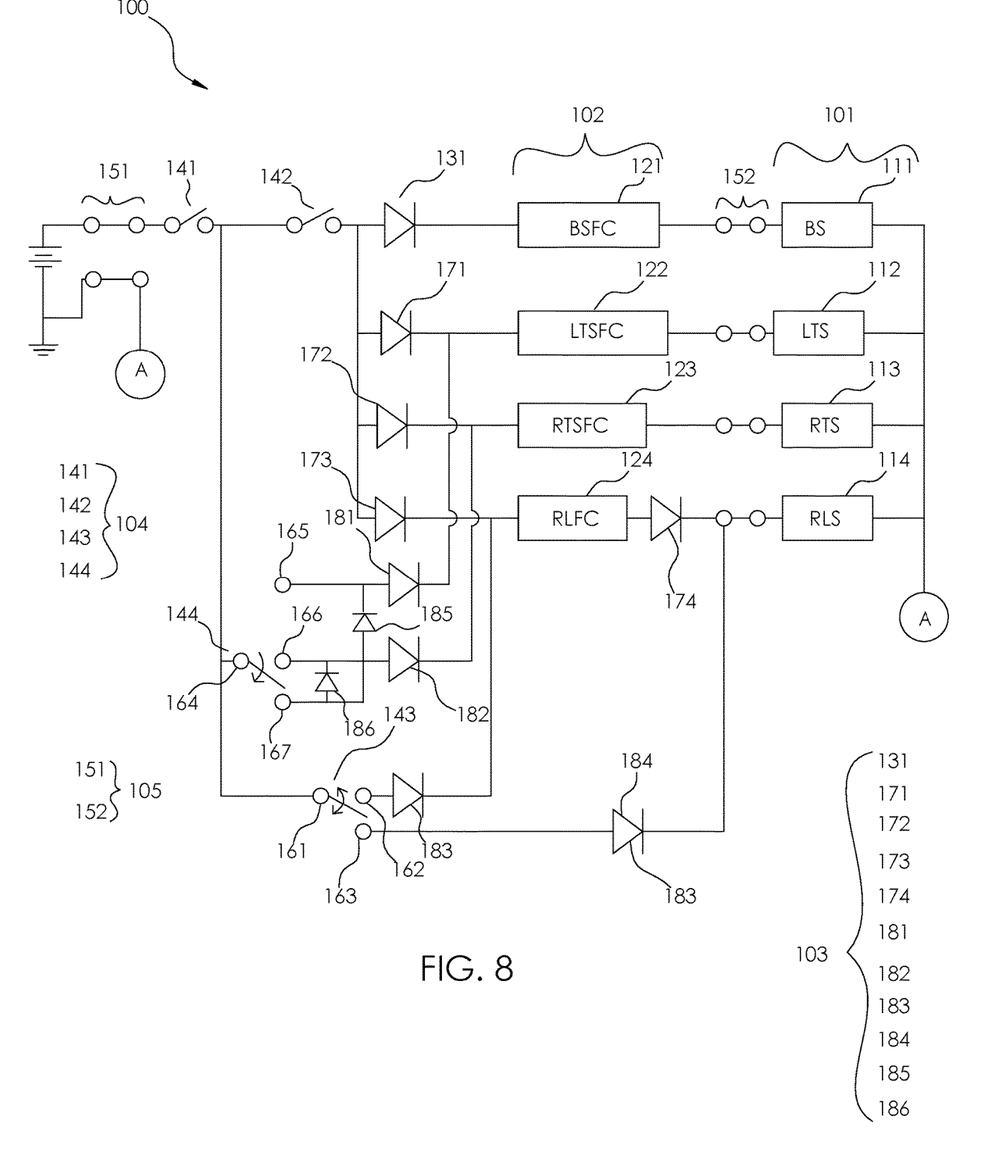
FIG. 8 is a schematic view of an embodiment of the disclosure.

Detailed reference will now be made to one or more potential embodiments of the disclosure, which are illustrated in FIGS. 1 through 8.

The fifth wheel trailer light testing device 100 (hereinafter invention) is a maintenance device. The invention 100 is adapted for use with a trailer. The invention 100 incorporates the plurality of trailer lights 101, a plurality of flashing circuits 102, a plurality of isolation diodes 103, a plurality of switches 104, and a wiring harness connector 105. The plurality of trailer lights 101, the plurality of flashing circuits 102, the plurality of isolation diodes 103, the plurality of switches 104, and the wiring harness connector 105 are electrically interconnected.

The invention 100 electrically tests a plurality of trailer lights 101. The invention 100 illuminates the plurality of trailer lights 101 to be sure that each trailer light selected from the plurality of trailer lights 101 is operating. The invention 100 is further configured to simultaneously flash all of the plurality of trailer lights 101.

Each trailer light selected from the plurality of trailer lights 101 is a lamp that mounts on the exterior surface of the trailer. The illumination generated by each trailer light selected from the plurality of trailer lights 101 is visible from the exterior of the trailer. The invention 100 controls the illumination of the plurality of trailer lights 101. The plurality of trailer lights 101 comprises a brake signal 111, a left turn signal 112, a right turn signal 113, and a running light signal 114.

The brake signal 111 is a lamp circuit. The brake signal 111 generates an illumination that is visible from the exterior of the trailer. The brake signal 111 illuminates when the braking system associated with the trailer is activated. The brake signal 111 is a signal that is specified within the FMVSS.

The left turn signal 112 is a lamp circuit. The left turn signal 112 generates an illumination that is visible from the exterior of the trailer. The left turn signal 112 illuminates to signal that the operator transporting the trailer intends to turn left. The left turn signal 112 is a signal that is specified within the FMVSS.

The right turn signal 113 is a lamp circuit. The right turn signal 113 generates an illumination that is visible from the exterior of the trailer. The right turn signal 113 illuminates to signal that the operator transporting the trailer intends to turn right. The right turn signal 113 is a signal that is specified within the FMVSS.

The running light signal 114 is a lamp circuit. The running light signal 114 generates an illumination that is visible from the exterior of the trailer. The illumination generated by the running light signal 114 provides a visible indication of the boundaries of the trailer as it is on the road. The running light signal 114 is a signal that is specified within the FMVSS.

Each flashing circuit selected from the plurality of flashing circuits 102 is an electric circuit. Each flashing circuit selected from the plurality of flashing circuits 102 is a timing circuit. Each flashing circuit selected from the plurality of flashing circuits 102 electrically connects a trailer light selected from the plurality of trailer lights 101. Each flashing circuit selected from the plurality of flashing circuits 102 flashes the trailer light associated with the selected flashing circuit. The plurality of flashing circuits 102 comprises a bs flashing circuit 121, a lts flashing circuit 122, a its flashing circuit 123, and a rl flashing circuit 124.

The bs flashing circuit 121 is an electric circuit. The bs flashing circuit 121 is a timing circuit. The bs flashing circuit 121 forms an electrical connection with the brake signal 111. The bs flashing circuit 121 generates the electric energy required to operate the brake signal 111. The bs flashing circuit 121 illuminates and extinguishes the illumination generated by the brake signal 111. The bs flashing circuit 121 forms a flashing circuit that causes the brake signal 111 to flash.

The lts flashing circuit 122 is an electric circuit. The lts flashing circuit 122 is a timing circuit. The lts flashing circuit 122 forms an electrical connection with the left turn signal 112. The lts flashing circuit 122 generates the electric energy required to operate the left turn signal 112. The lts flashing circuit 122 illuminates and extinguishes the illumination generated by the left turn signal 112. The lts flashing circuit 122 forms a flashing circuit that causes the left turn signal 112 to flash.

The rts flashing circuit 123 is an electric circuit. The rts flashing circuit 123 is a timing circuit. The rts flashing circuit 123 forms an electrical connection with the right turn signal 113. The rts flashing circuit 123 generates the electric energy required to operate the right turn signal 113. The rts flashing circuit 123 illuminates and extinguishes the illumination generated by the right turn signal 113. The rts flashing circuit 123 forms a flashing circuit that causes the right turn signal 113 to flash.

The rl flashing circuit 124 is an electric circuit. The rl flashing circuit 124 is a timing circuit. The rl flashing circuit 124 forms an electrical connection with the running light signal 114. The rl flashing circuit 124 generates the electric energy required to operate the running light signal 114. The rl flashing circuit 124 illuminates and extinguishes the illumination generated by the running light signal 114. The rl flashing circuit 124 forms a flashing circuit that causes the running light signal 114 to flash.

Each isolation diode selected from the plurality of isolation diodes 103 is a diode. Each isolation diode selected from the plurality of isolation diodes 103 limits the flow of electric energy through the invention 100 to a single direction. The plurality of isolation diodes 103 control the directions of the flows of electric energy through the invention 100. The plurality of isolation diodes 103 comprises a blfc isolation diode 131, a first ltsfc isolation diode 171, a first rtsfc isolation diode 172, a first rlfc input isolation diode 173, a first rlfc output isolation diode 174, a second ltsfc isolation diode 181, a second rtsfc isolation diode 182, a second rlfc input isolation diode 183, a second rlfc output isolation diode 184, a first blocking diode 185, and a second blocking diode 186.

The blfc isolation diode 131 is an isolation diode. The blfc isolation diode 131 installs between the second spst switch 142 and the bs flashing circuit 121 such that electric energy will only flow in the direction from the second spst switch 142 into the bs flashing circuit 121. The anode of the blfc isolation diode 131 electrically connects to the second spst switch 142. The cathode of the blfc isolation diode 131 electrically connects to the bs flashing circuit 121.

The first rlfc output isolation diode 174 is a diode. The first ltsfc isolation diode 171 electrically connects between the second spst switch 142 and the lts flashing circuit 122 such that electric energy will only flow in the direction from the second spst switch 142 to the lts flashing circuit 122.

The first rtsfc isolation diode 172 electrically connects between the second spst switch 142 and the rts flashing circuit 123 such that electric energy will only flow in the direction from the second spst switch 142 to the rts flashing circuit 123.

The first rlfc input isolation diode 173 electrically connects between the second spst switch 142 and the rl flashing circuit 124 such that electric energy will only flow in the direction from the second spst switch 142 to the rl flashing circuit 124.

The first rlfc output isolation diode 174 electrically connects between the rl flashing circuit 124 and the lamp circuit plug 152 such that electric energy will only flow in the direction from the rl flashing circuit 124 to the lamp circuit plug 152.

The second ltsfc isolation diode 181 electrically connects between the sp3t switch 144 and the lts flashing circuit 122 such that electric energy will only flow in the direction from the sp3t switch 144 to the lts flashing circuit 122. The cathode of the second ltsfc isolation diode 181 forms an electric connection with the lts flashing circuit 122. The cathode of the second ltsfc isolation diode 181 further forms an electric connection with the cathode of the first ltsfc isolation diode 171. The second ltsfc isolation diode 181 prevents electric energy from the first ltsfc isolation diode 171 from entering the sp3t switch 144. The first ltsfc isolation diode 171 prevents electric energy from the second ltsfc isolation diode 181 from entering the second spst switch 142.

The second rtsfc isolation diode 182 electrically connects between the sp3t switch 144 and the rts flashing circuit 123 such that electric energy will only flow in the direction from the sp3t switch 144 to the rts flashing circuit 123. The cathode of the second rtsfc isolation diode 182 forms an electric connection with the rts flashing circuit 123. The cathode of the second rtsfc isolation diode 182 further forms an electric connection with the cathode of the first rtsfc isolation diode 172. The second rtsfc isolation diode 182 prevents electric energy from the first rtsfc isolation diode 172 from entering the sp3t switch 144. The first rtsfc isolation diode 172 prevents electric energy from the second rtsfc isolation diode 182 from entering the second spst switch 142.

The second rlfc input isolation diode 183 electrically connects between the spdt switch 143 and the rl flashing circuit 124 such that electric energy will only flow in the direction from the spdt switch 143 to the rl flashing circuit 124. The cathode of the second rlfc input isolation diode 183 forms an electric connection with the rl flashing circuit 124. The cathode of the second rlfc input isolation diode 183 further forms an electric connection with the cathode of the first rlfc input isolation diode 173. The second rlfc input isolation diode 183 prevents electric energy from the first rlfc input isolation diode 173 from entering the spdt switch 143. The first rlfc input isolation diode 173 prevents electric energy from the second rlfc input isolation diode 183 from entering the second spst switch 142.

The second rlfc output isolation diode 184 electrically connects between the spdt switch 143 and the running light signal 114 through the power circuit plug 151 such that electric energy will only flow in the direction from the spdt switch 143 to the running light signal 114. The cathode of the second rlfc output isolation diode 184 forms an electric connection with the running light signal 114. The cathode of the second rlfc output isolation diode 184 further forms an electric connection with the cathode of the first rlfc output isolation diode 174. The second rlfc output isolation diode 184 prevents electric energy from the first rlfc output isolation diode 174 from entering the spdt switch 143. The first rlfc output isolation diode 174 prevents electric energy from the second rlfc output isolation diode 184 from entering the rl flashing circuit 124.

The cathode of the first blocking diode 185 forms an electric connection with the anode of the second ltsfc isolation diode 181. The first blocking diode 185 isolates the anode of the second ltsfc isolation diode 181 from the anode of the second rtsfc isolation diode 182 such that a voltage presented at the fifth lead 165 of the spdt switch 143 will not backflow to the anode of the second rtsfc isolation diode 182.

The cathode of the second blocking diode 186 forms an electric connection with the anode of the second rtsfc isolation diode 182. The second blocking diode 186 isolates the anode of the second rtsfc isolation diode 182 from the anode of the second ltsfc isolation diode 181 such that a voltage presented at the sixth lead 166 of the spdt switch 143 will not backflow to the anode of the second ltsfc isolation diode 181.

Each switch selected from the plurality of switches 104 is a maintained electric switch. The plurality of switches 104 forms a switching circuit that controls the operation of the invention 100. The plurality of switches 104 comprises a first spst switch 141, a second spst switch 142, a spdt switch 143, and a sp3t switch 144.

The first spst switch 141 forms the power switch for the invention 100. The second spst switch 142 controls the simultaneous illumination of all of the plurality of trailer lights 101 in a flashing mode. The spdt switch 143 controls the flow of electric energy from the first spst switch 141 into the running light signal 114. The sp3t switch 144 controls the flow of electric energy from the first spst switch 141 into the lts flashing circuit 122 and the its flashing circuit 123.

The first spst switch 141 is a maintained electric switch. The first spst switch 141 forms an electric connection between the power circuit plug 151 and the second spst switch 142. The first spst switch 141 forms an electric connection between the power circuit plug 151 and the spdt switch 143. The first spst switch 141 forms an electric connection between the power circuit plug 151 and the sp3t switch 144. The first spst switch 141 controls the flow of electric energy from the external power source through the power circuit plug 151 and into the second spst switch 142, the spdt switch 143, and the sp3t switch 144.

The second spst switch 142 is a maintained electric switch. The second spst switch 142 forms an electric connection between the first spst switch 141 and the anode of the first ltsfc isolation diode 171. The second spst switch 142 forms an electric connection between the first spst switch 141 and the anode of the first rtsfc isolation diode 172. The second spst switch 142 forms an electric connection between the first spst switch 141 and the anode of the first rlfc input isolation diode 173. The second spst switch 142 controls the flow of electric energy from the first spst switch 141 into the first ltsfc isolation diode 171, the first rtsfc isolation diode 172, and the first rlfc input isolation diode 173.

The spdt switch 143 is a single pole double throw maintained switch. The spdt switch 143 forms a selectable electric connection between the first spst switch 141 and an isolation diode selected from the group consisting of the second rlfc input isolation diode 183 and the second rlfc output isolation diode 184. The spdt switch 143 controls the flow of electric energy from the first spst switch 141 into the selected isolating diode. The spdt switch 143 further comprises a first lead 161, a second lead 162, and a third lead 163.

The first lead 161 is the lead of the spdt switch 143 that electrically connects to the anode of the first spst switch 141. The second lead 162 is the lead of the spdt switch 143 that electrically connects to the anode of the second rlfc input isolation diode 183. The third lead 163 is the lead of the spdt switch 143 that electrically connects to the anode of the second rlfc output isolation diode 184.

The sp3t switch 144 is a single pole triple throw maintained switch. The sp3t switch 144 forms a selectable electric connection between the first spst switch 141 and one or more isolation diodes selected from the group consisting of the second ltsfc isolation diode 181 and the second rtsfc isolation diode 182, the first blocking diode 185, and the second blocking diode 186. The sp3t switch 144 controls the flow of electric energy from the first spst switch 141 into the one or more selected isolating diodes. The sp3t switch 144 further comprises a fourth lead 164, a fifth lead 165, a sixth lead 166, and a seventh lead 167.

The fourth lead 164 is the lead of the sp3t switch 144 that electrically connects to the anode of the first spst switch 141. The fifth lead 165 is the lead of the sp3t switch 144 that electrically connects to the anode of the second ltsfc isolation diode 181. The sixth lead 166 is the lead of the sp3t switch 144 that electrically connects to the anode of the second rtsfc isolation diode 182. The seventh lead 167 is the lead of the sp3t switch 144 that electrically connects to the anodes of the both the first blocking diode 185 and the second blocking diode 186.

The wiring harness connector 105 is an electrical connector. The wiring harness connector 105 forms a detachable electric connection between the external power source and the plurality of switches 104. The wiring harness connector 105 further forms a detachable electric connection between both: a) the plurality of flashing circuits 102 and the plurality of trailer lights 101; and, c) the plurality of isolation diodes 103 and the plurality of trailer lights 101. The wiring harness connector 105 further comprises a power circuit plug 151 and a lamp circuit plug 152.

The power circuit plug 151 is a detachable electrical connection. The power circuit plug 151 is incorporated into the wiring harness connector 105. The power circuit plug 151 forms the electrical connections that electrically connects the plurality of switches 104 to the external power source. The external power source is an electrochemical device. The external power source converts chemical potential energy into electric energy that is used to power the operation of the invention 100. The external power source is an externally provided device.

The lamp circuit plug 152 is a detachable electrical connection. The lamp circuit plug 152 is incorporated into the wiring harness connector 105. The lamp circuit plug 152 forms the electrical connections that electrically connects the plurality of flashing circuits 102 and the plurality of isolation diodes 103 to the plurality of trailer lights 101.

The following definitions were used in this disclosure:

Anodes and Cathodes: As used in this disclosure, an anode and a cathode are the connecting terminals of an electrical circuit element or device. Technically, the cathode is the terminal through which the physical electrons flow into the device. The anode is the terminal through which the physical electrons flow out of the device. As a practical matter the anode refers to: 1) the positive terminal of a power consuming electrical circuit element; 2) the negative terminal of a discharging battery or an electrical power source; and, 3) the positive terminal of a charging battery. As a further practical matter the cathode refers to: 1) the negative terminal of a power consuming electrical circuit element; 2) the positive terminal of a discharging battery or an electrical power source; and, 3) the negative terminal of a charging battery.

Brake: As used in this disclosure, a brake is a device that is used to slow or stop the motion of a machine or a vehicle.

Battery: As used in this disclosure, a battery is a chemical device consisting of one or more cells, in which chemical energy is converted into electricity and used as a source of power. Batteries are commonly defined with a positive terminal and a negative terminal.

Control Circuit: As used in this disclosure, a control circuit is an electrical circuit that manages and regulates the behavior or operation of a device.

Diode: As used in this disclosure, a diode is a two terminal semiconductor device that allows current flow in only one direction. The two terminals are called the anode and the cathode. Electric current is allowed to pass from the anode to the cathode.

Electrical Ground: As used in this disclosure, an electrical ground is a common reference voltage that is used in the design and implementation of electrical circuits. An electrical ground is often, but not necessarily, the discharge point of electric currents flowing through an electric circuit.

Electromagnetic Radiation: As used in this disclosure, electromagnetic radiation refers to an interaction between electric fields and magnetic fields that is capable of transmitting energy through a vacuum.

External Power Source: As used in this disclosure, an external power source is a source of the energy that is externally provided to enable the operation of the present disclosure. Examples of external power sources include, but are not limited to, electrical power sources and compressed air sources.

Extinguish: As used in this disclosure, to extinguish means to cause a device to stop generating an illumination.

Flash: As used in this disclosure, to flash means to illuminate and extinguish a lamp in a rhythmic pattern.

FMVSS: As used in this disclosure, FMVSS is an abbreviation for Federal Motor Vehicle Safety Standard.

Illumination: As used in this disclosure, illumination refers to electromagnetic radiation contained with an area. Illumination is a synonym for light, particularly in cases where a measure of the amount of visible electromagnetic radiation in a space is called for. The verb form of illumination is to illuminate and is taken to mean the generation of an illumination.

Interval: As used in this disclosure, the term interval refers to a period of time between a first event and a second event. The term regular interval is used to mean that the period of time between the first event and the second event remains constant. This disclosure assumes that the selected second event can be a repetition of the first event.

Light: As used in this disclosure, light refers to electromagnetic radiation that illuminates an area. Illumination is a synonym for light, particularly in cases where a measure of the amount of light in a space is called for.

Lamp: As used in this disclosure, a lamp is an electrical circuit that generates (typically visible spectrum) electromagnetic radiation.

Maintained Switch: As used in this disclosure, a maintained switch is a switch that maintains the position that was set in the most recent switch actuation. A maintained switch works in an opposite manner to a momentary switch.

Momentary Switch: As used in this disclosure, a momentary switch is a biased switch in the sense that the momentary switch has a baseline position that only changes when the momentary switch is actuated (for example when a pushbutton switch is pushed or a relay coil is energized). The momentary switch then returns to the baseline position once the actuation is completed. This baseline position is called the "normal" position. For example, a "normally open" momentary switch interrupts (open) the electric circuit in the baseline position and completes (closes) the circuit when the momentary switch is activated. Similarly, a "normally closed" momentary switch will complete (close) an electric circuit in the baseline position and interrupt (open) the circuit when the momentary switch is activated.

Plug: As used in this disclosure, a plug is an electrical termination that electrically connects a first electrical circuit to a second electrical circuit or a source of electricity. As used in this disclosure, a plug will have two or three metal pins.

Poles, Throws, and Switches: As used in this disclosure, the terms pole and throw are descriptions associated with an electrical switch. A pole refers to an electrical circuit the switch feeds electrical current into. The number of poles associated with the switch refers to the maximum number of independent circuits a switch can theoretically support. Because the circuits supported by the poles of a switch can be interconnected, a switch will often support fewer independent electrical circuits than the actual number of poles. The number of throws associated with a switch refers to the maximum number of electrical connections that can be made within an individual pole of the switch.

Port: As used in this disclosure, a port is an electrical termination that is used to connect a first electrical circuit to a second external electrical circuit. In this disclosure, the port is designed to receive a plug.

Rhythm: As used in this disclosure, a rhythm refers to a pattern that repeats at regular intervals.

Switch: As used in this disclosure, a switch is an electrical device that starts and stops the flow of electricity through an electric circuit by completing or interrupting an electric circuit. The act of completing or breaking the electrical circuit is called actuation. Completing or interrupting an electric circuit with a switch is often referred to as closing or opening a switch respectively. Completing or interrupting an electric circuit is also often referred to as making or breaking the circuit respectively.

Timing Circuit: As used in this disclosure, a timing circuit refers to an electrical network of interconnected electrical elements, potentially including but not limited to, resistors, capacitors, diodes, transistors, and integrated circuit devices. The purpose of the timing circuit is to generate an electrical control signal after a predetermined amount of time. In common usage, a timing circuit is also referred to as timing circuitry. The "555" timing circuit is a well-known, documented, and commercially available timing circuit.

Timing Device: As used in this disclosure, the timing device is a device configured for use in measuring the passage of time. The timing device is often called a timer.

Tractor: As used in this disclosure, a tractor refers to a vehicle that is used to tow a trailer.

Trailer: As used in this disclosure, a trailer is an unpowered wheeled vehicle that is towed by a powered vehicle such as a tractor.

Visible Light: As used in this disclosure, visible light refers electromagnetic radiation with a wavelength in the approximate range of 400 nanometers to 800 nanometers.

With respect to the above description, it is to be realized that the optimum dimensional relationship for the various components of the invention described above and in FIGS. 1 through 8 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A trailer light testing device comprising
wherein the trailer light testing device incorporates a plurality of trailer lights, a plurality of flashing circuits, a plurality of isolation diodes, a plurality of switches, and a wiring harness connector;
wherein the plurality of trailer lights, the plurality of flashing circuits, the plurality of isolation diodes, the plurality of switches, and the wiring harness connector are electrically interconnected;
wherein the trailer light testing device is configured to simultaneously flash all of the plurality of trailer lights of a trailer;
wherein the plurality of switches comprises a first spst switch, a second spst switch, a spdt switch, and a sp3t switch;
wherein the first spst switch forms a power switch for the trailer light testing device;
wherein the second spst switch controls the simultaneous illumination of all of the plurality of switches in a flashing mode;
wherein the spdt switch controls the flow of electric energy from the first spst switch into a running light signal;
wherein the sp3t switch controls the flow of electric energy from the first spst switch into an lts flashing circuit and an its flashing circuit.

2. The trailer light testing device according to claim 1
wherein the trailer light testing device electrically tests the plurality of trailer lights;
wherein the trailer light testing device illuminates the plurality of trailer lights to be sure that each trailer light selected from the plurality of trailer lights is operating.

3. The trailer light testing device according to claim 2
wherein each trailer light selected from the plurality of trailer lights is a lamp that mounts on an exterior surface of the trailer;
wherein the illumination generated by each trailer light selected from the plurality of trailer lights is visible from the exterior of the trailer;
wherein the trailer light testing device controls the illumination of the plurality of trailer lights.

4. The trailer light testing device according to claim 3
wherein each flashing circuit selected from the plurality of flashing circuits is an electric circuit;
wherein each flashing circuit selected from the plurality of flashing circuits is a timing circuit;
wherein each flashing circuit selected from the plurality of flashing circuits electrically connects a trailer light selected from the plurality of trailer lights;
wherein each flashing circuit selected from the plurality of flashing circuits flashes the trailer light associated with the selected flashing circuit.

5. The trailer light testing device according to claim 4
wherein each isolation diode selected from the plurality of isolation diodes is a diode;
wherein each isolation diode selected from the plurality of isolation diodes limits the flow of electric energy through the trailer light testing device to a single direction;
wherein the plurality of isolation diodes control the electric energy flow directions through the trailer light testing device.

6. The trailer light testing device according to claim 5
wherein each switch selected from the plurality of switches is a maintained electric switch;
wherein the plurality of switches forms a switching circuit that controls the operation of the trailer light testing device.

7. The trailer light testing device according to claim 6
wherein the plurality of trailer lights comprises a brake signal, a left turn signal, a right turn signal, and a running light signal;
wherein the brake signal is a lamp circuit;
wherein the brake signal generates an illumination that is visible from the exterior of the trailer;
wherein the brake signal illuminates when a braking system associated with the trailer is activated;
wherein the left turn signal is a lamp circuit;
wherein the left turn signal generates an illumination that is visible from the exterior of the trailer;
wherein the left turn signal illuminates to signal that an operator transporting the trailer intends to turn left;

wherein the right turn signal is a lamp circuit;
wherein the right turn signal generates an illumination that is visible from the exterior of the trailer;
wherein the right turn signal illuminates to signal that the operator transporting the trailer intends to turn right;
wherein the running light signal is a lamp circuit;
wherein the running light signal generates an illumination that is visible from the exterior of the trailer;
wherein the illumination generated by the running light signal provides a visible indication of the boundaries of the trailer as it is on the road.

8. The trailer light testing device according to claim 7 wherein the plurality of flashing circuits comprises a bs flashing circuit, the lts flashing circuit, the rts flashing circuit, and a rl flashing circuit;
wherein the bs flashing circuit forms an electrical connection with the brake signal;
wherein the lts flashing circuit forms an electrical connection with the left turn signal;
wherein the rts flashing circuit forms an electrical connection with the right turn signal;
wherein the rl flashing circuit forms an electrical connection with the running light signal.

9. The trailer light testing device according to claim 8 wherein the plurality of isolation diodes comprises a blfc isolation diode, a first ltsfc isolation diode, a first rtsfc isolation diode, a first rlfc input isolation diode, a first rlfc output isolation diode, a second ltsfc isolation diode, a second rtsfc isolation diode, a second rlfc input isolation diode, a second rlfc output isolation diode, a first blocking diode, and a second blocking diode;
wherein the blfc isolation diode is an isolation diode;
wherein the blfc isolation diode installs between the second spst switch and the bs flashing circuit such that electric energy will only flow in the direction from the second spst switch into the bs flashing circuit;
wherein the anode of the blfc isolation diode electrically connects to the second spst switch;
wherein the cathode of the blfc isolation diode electrically connects to the bs flashing circuit;
wherein the first rlfc output isolation diode is a diode;
wherein the first ltsfc isolation diode electrically connects between the second spst switch and the lts flashing circuit such that electric energy will only flow in the direction from the second spst switch to the lts flashing circuit;
wherein the first rtsfc isolation diode electrically connects between the second spst switch and the rts flashing circuit such that electric energy will only flow in the direction from the second spst switch to the rts flashing circuit;
wherein the first rlfc input isolation diode electrically connects between the second spst switch and the rl flashing circuit such that electric energy will only flow in the direction from the second spst switch to the rl flashing circuit;
wherein the first rlfc output isolation diode electrically connects between the rl flashing circuit and a lamp circuit plug such that electric energy will only flow in the direction from the rl flashing circuit to the lamp circuit plug;
wherein the second ltsfc isolation diode electrically connects between the sp3t switch and the lts flashing circuit such that electric energy will only flow in the direction from the sp3t switch to the lts flashing circuit;
wherein the cathode of the second ltsfc isolation diode forms an electric connection with the lts flashing circuit;
wherein the cathode of the second ltsfc isolation diode further forms an electric connection with the cathode of the first ltsfc isolation diode;
wherein the second ltsfc isolation diode prevents electric energy from the first ltsfc isolation diode from entering the sp3t switch;
wherein the first ltsfc isolation diode prevents electric energy from the second ltsfc isolation diode from entering the second spst switch;
wherein the second rtsfc isolation diode electrically connects between the sp3t switch and the rts flashing circuit such that electric energy will only flow in the direction from the sp3t switch to the rts flashing circuit;
wherein the cathode of the second rtsfc isolation diode forms an electric connection with the rts flashing circuit;
wherein the cathode of the second rtsfc isolation diode further forms an electric connection with the cathode of the first rtsfc isolation diode;
wherein the second rtsfc isolation diode prevents electric energy from the first rtsfc isolation diode from entering the sp3t switch;
wherein the first rtsfc isolation diode prevents electric energy from the second rtsfc isolation diode from entering the second spst switch;
wherein the second rlfc input isolation diode electrically connects between the spdt switch and the rl flashing circuit such that electric energy will only flow in the direction from the spdt switch to the rl flashing circuit;
wherein the cathode of the second rlfc input isolation diode forms an electric connection with the rl flashing circuit;
wherein the cathode of the second rlfc input isolation diode further forms an electric connection with the cathode of the first rlfc input isolation diode;
wherein the second rlfc input isolation diode prevents electric energy from the first rlfc input isolation diode from entering the spdt switch;
wherein the first rlfc input isolation diode prevents electric energy from the second rlfc input isolation diode from entering the second spst switch;
wherein the second rlfc output isolation diode electrically connects between the spdt switch and the running light signal through a power circuit plug such that electric energy will only flow in the direction from the spdt switch to the running light signal;
wherein the cathode of the second rlfc output isolation diode forms an electric connection with the running light signal;
wherein the cathode of the second rlfc output isolation diode further forms an electric connection with the cathode of the first rlfc output isolation diode;
wherein the second rlfc output isolation diode prevents electric energy from the first rlfc output isolation diode from entering the spdt switch;
wherein the first rlfc output isolation diode prevents electric energy from the second rlfc output isolation diode from entering the rl flashing circuit;
wherein the cathode of the first blocking diode forms an electric connection with the anode of the second ltsfc isolation diode;
wherein the first blocking diode isolates the anode of the second ltsfc isolation diode from the anode of the second rtsfc isolation diode;

wherein the cathode of the second blocking diode forms an electric connection with the anode of the second rtsfc isolation diode;

wherein the second blocking diode isolates the anode of the second rtsfc isolation diode from the anode of the second ltsfc isolation diode.

10. The trailer light testing device according to claim 9 wherein the bs flashing circuit is an electric circuit;

wherein the bs flashing circuit is a timing circuit;

wherein the bs flashing circuit generates the electric energy required to operate the brake signal;

wherein the bs flashing circuit illuminates and extinguishes the illumination generated by the brake signal;

wherein the bs flashing circuit forms a flashing circuit that causes the brake signal to flash.

11. The trailer light testing device according to claim 10 wherein the lts flashing circuit is an electric circuit;

wherein the lts flashing circuit is a timing circuit;

wherein the lts flashing circuit generates the electric energy required to operate the left turn signal;

wherein the lts flashing circuit illuminates and extinguishes the illumination generated by the left turn signal;

wherein the lts flashing circuit forms a flashing circuit that causes the left turn signal to flash;

wherein the rts flashing circuit is an electric circuit;

wherein the rts flashing circuit is a timing circuit;

wherein the rts flashing circuit generates the electric energy required to operate the right turn signal;

wherein the rts flashing circuit illuminates and extinguishes the illumination generated by the right turn signal;

wherein the rts flashing circuit forms a flashing circuit that causes the right turn signal to flash.

12. The trailer light testing device according to claim 11 wherein the rl flashing circuit is an electric circuit;

wherein the rl flashing circuit is a timing circuit;

wherein the rl flashing circuit generates the electric energy required to operate the running light signal;

wherein the rl flashing circuit illuminates and extinguishes the illumination generated by the running light signal;

wherein the rl flashing circuit forms a flashing circuit that causes the running light signal to flash.

13. The trailer light testing device according to claim 12 wherein the first spst switch is a maintained electric switch;

wherein the first spst switch forms an electric connection between the power circuit plug and the second spst switch;

wherein the first spst switch forms an electric connection between the power circuit plug and the spdt switch;

wherein the first spst switch forms an electric connection between the power circuit plug and the sp3t switch;

wherein the first spst switch controls the flow of electric energy from an external power source through the power circuit plug and into the second spst switch, the spdt switch, and the sp3t switch;

wherein the second spst switch is a maintained electric switch;

wherein the second spst switch forms an electric connection between the first spst switch and the anode of the first ltsfc isolation diode;

wherein the second spst switch forms an electric connection between the first spst switch and the anode of the first rtsfc isolation diode;

wherein the second spst switch forms an electric connection between the first spst switch and the anode of the first rlfc input isolation diode;

wherein the second spst switch controls the flow of electric energy from the first spst switch into the first ltsfc isolation diode, the first rtsfc isolation diode, and the first rlfc input isolation diode;

wherein the spdt switch is a single pole double throw maintained switch;

wherein the spdt switch forms a selectable electric connection between the first spst switch and an isolation diode selected from the group consisting of the second rlfc input isolation diode and the second rlfc output isolation diode;

wherein the spdt switch controls the flow of electric energy from the first spst switch into the selected isolating diode;

wherein the sp3t switch is a single pole triple throw maintained switch;

wherein the sp3t switch forms a selectable electric connection between the first spst switch and one or more isolation diodes selected from the group consisting of the second ltsfc isolation diode and the second rtsfc isolation diode, the first blocking diode, and the second blocking diode;

wherein the sp3t switch controls the flow of electric energy from the first spst switch into the one or more selected isolating diodes.

14. The trailer light testing device according to claim 13 wherein the wiring harness connector is an electrical connector;

wherein the wiring harness connector forms a detachable electric connection between the external power source and the plurality of switches;

wherein the wiring harness connector further forms a detachable electric connection between both: a) the plurality of flashing circuits and the plurality of trailer lights; and, c) the plurality of isolation diodes and the plurality of trailer lights.

\* \* \* \* \*